United States Patent [19]

Furuta

[11] Patent Number: 4,980,800
[45] Date of Patent: Dec. 25, 1990

[54] ELECTRONIC UNIT RETENTION SYSTEM

[75] Inventor: Steven J. Furuta, Santa Clara, Calif.

[73] Assignee: Sun Microsystems, Inc., Mountain View, Calif.

[21] Appl. No.: 413,465

[22] Filed: Sep. 27, 1989

[51] Int. Cl.$^5$ .............................................. H02B 1/04
[52] U.S. Cl. ................................. 361/391; 200/50 R; 200/61.61; 292/144; 312/333; 361/339; 439/347
[58] Field of Search ............... 235/10, 11, 22; 200/12, 200/50 R, 50 AA, 43.01, 61.58 R, 61.61; 361/143, 160, 338, 339, 343, 390, 391; 439/346, 347; 292/144, 302; 312/333

[56] References Cited

U.S. PATENT DOCUMENTS

| | | | |
|---|---|---|---|
| 3,918,752 | 11/1975 | Leone | 292/302 |
| 4,132,439 | 1/1979 | Miller | 292/144 |
| 4,603,239 | 7/1986 | Ishii | 200/61.61 |
| 4,616,863 | 10/1986 | Bryant | 292/302 |
| 4,720,611 | 1/1988 | Ishii | 200/61.61 |
| 4,917,419 | 4/1990 | Mora, Jr. | 292/144 |

*Primary Examiner*—Gerald P. Tolin
*Attorney, Agent, or Firm*—Blakely, Sokoloff, Taylor and Zafman

[57] ABSTRACT

An electronic unit retention system is shown. With the present invention, electronic modules are kept retained within a system housing so long as power supplied to the module. A bracket is mounted within a module along its back wall. One or more guide pins extend from a back plane of the housing towards the center of the unit. A solenoid is mounded on the bracket and connected to the module's internal power supply. The solenoid is connected to the power supply in such a way that whenever power is supplied to the module, the solenoid is energized. The solenoid is designed such that when power is disconnected from the solenoid, and the solenoid is de-energized, the solenoid pin in the solenoid is withdrawn into the solenoid body. When the solenoid is energized, the solenoid pin extends. The solenoid is mounted on the bracket in such a way that when the pin is extended, it interacts with the guide pin and prevents the module from being moved. The solenoid pin contacts the guide pin tangentially. Contact is made in a location where the diameter of the guide pin is narrower than the rest of the pin. The solenoid pin is locked into position in this recessed portion and prevents the module from moving.

6 Claims, 2 Drawing Sheets

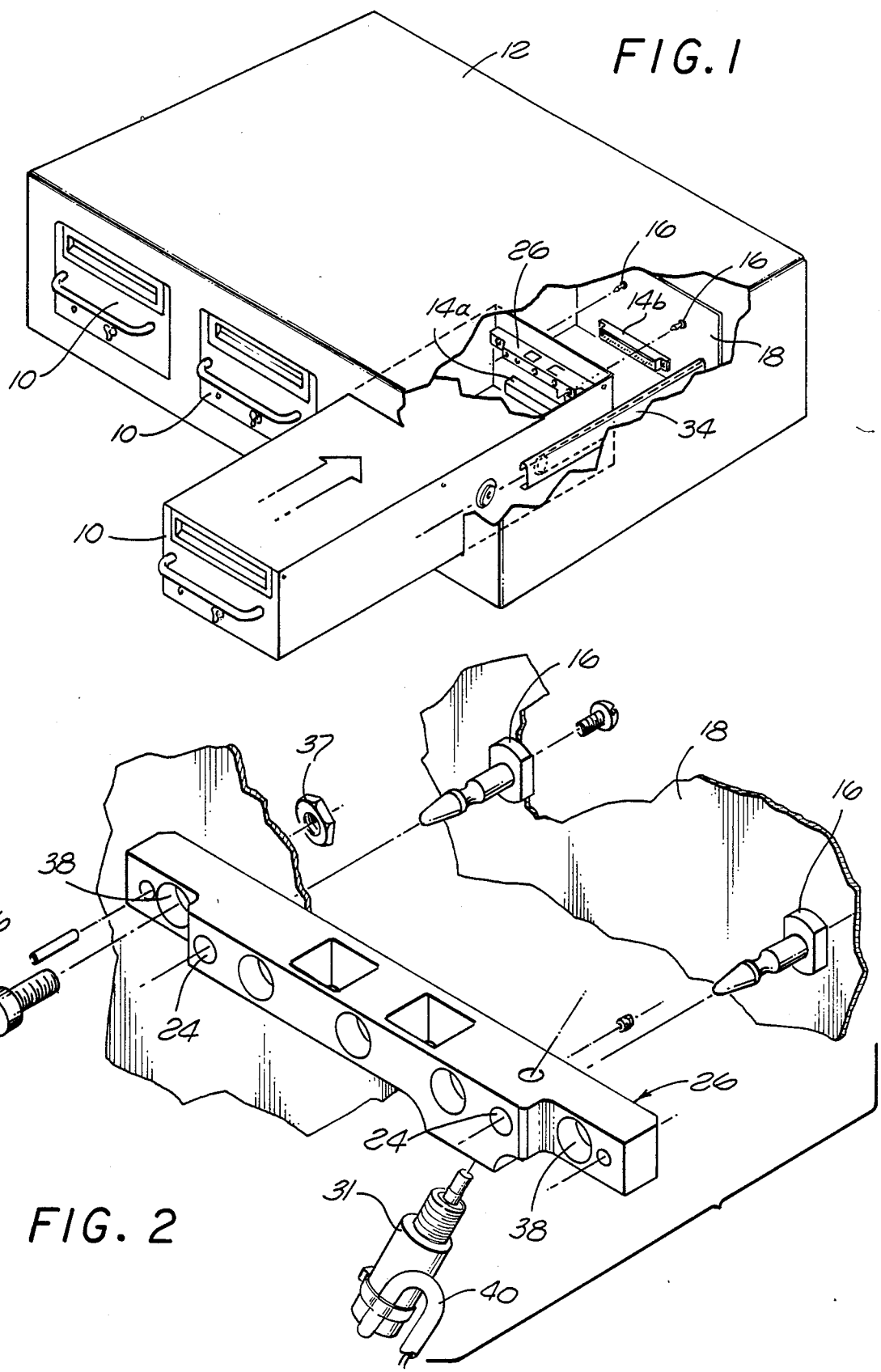

ELECTRONIC UNIT RETENTION SYSTEM

BACKGROUND

A. Field of the Invention

The present invention relates to the field of modular electronic devices, and more particularly to a locking device for retaining computer peripheral modules within a computer system housing.

B. Art Background

A personal computer system is typically made up of a number of components. In addition to the central processing unit (CPU), there are peripheral units such as video displays, memory units, disk drives, tape drives, printers, and others. Often, these units are incorporated into a housing that also contains the CPU. The peripheral units may be contained within modules. These modules are connected to and can be removed from the housing, allowing the user of the computer system to customize its features.

The modules are placed within the housing in a manner similar to drawers. The modules are supported by rails and slide into the housing on the rails. Typically, modules are in the shape of a rectangular box, although other shapes can be used. When electrical power is turned on, the modules are automatically powered up.

The peripheral modules must be electrically and physically connected to the housing which holds the computer system. An electrical connection is necessary because the CPU must be able to communicate with the peripheral devices and pass data to and from them. Also, the peripheral unit needs to be connected to the computer system's power supply and the communications bus. The electrical connection is most often made by means of a pair of connectors. One connector is mounted on the housing, and the other is mounted on the module. As the module is placed within the housing, the connectors are aligned so that the electrical connection is automatically made between the peripheral device and the rest of the computer system.

It has been found that it is undesirable to disconnect the modules from the housing while the computer system is turned on and electrical power is supported to the modules. If the modules are disconnected from the power supply, electrical noise spikes can occur across the connector pins. These noise spikes are undesirable because they may lead to spurious data signals and in some instances may even damage the peripheral device. It is therefore desirable to provide a means for retaining the module inside the system housing while power is supplied to the module.

In the prior art, methods are known which hold the peripheral modules in the housing. For example, locking screws may be placed on the front panel of the module. When the module is placed within the housing, the screws are tightened thereby holding the module in place. However, this method has a disadvantage in that the screws can be unfastened at any time. Thus, a user may possibly release the locking screw and remove the module from the housing when power is connected to the computer system. The prior art does not provide a method for insuring that the modules remain within the housing whenever the computer system is powered up.

BRIEF DESCRIPTION OF THE INVENTION

It has been found that the foregoing limitations can be overcome by the use of the electronic unit retention system of the present invention. With the present invention, electronic modules are kept retained within a system housing so long as power is supplied to the module. A bracket is mounted within the module along its back wall. One or more guide pins extend from a back plane of the housing towards the center of the unit. As the module is placed within the housing, the guide pins pass through holes located in the back of the module and into the bracket. A solenoid is mounded on the bracket and connected to the module's internal power supply. The solenoid is connected to the power supply in such a way that whenever power is supplied to the module, the solenoid is energized. The solenoid is designed such that when power is disconnected from the solenoid, and the solenoid is de-energized, the solenoid pin in the solenoid is withdrawn into the solenoid body. When the solenoid is energized, the solenoid pin extends. The solenoid is mounted on the bracket in such a way that when the pin is extended, it interacts with the guide pin and prevents the module from being moved. This keeps the module retained within the system housing. In the preferred embodiment, the solenoid pin contacts the guide pin tangentially. Contact is made in a location where the diameter of the guide pin is narrower than the rest of the pin. The solenoid pin is locked into position in this recessed portion and prevents the module from moving. In this manner, the module is automatically retained within the computer system whenever the system is powered up. No human intervention is necessary, and the operation of the entire device is entirely automatic.

BRIEF DESCRIPTION OF THE DRAWINGS

FIG. 1 illustrates a computer peripheral module employing the present invention as it is being inserted into a computer system housing.

FIG. 2 is exploded perspective view showing the relationship of the mounting bracket and the guide pins.

DETAILED DESCRIPTION OF THE INVENTION

Figure 3:
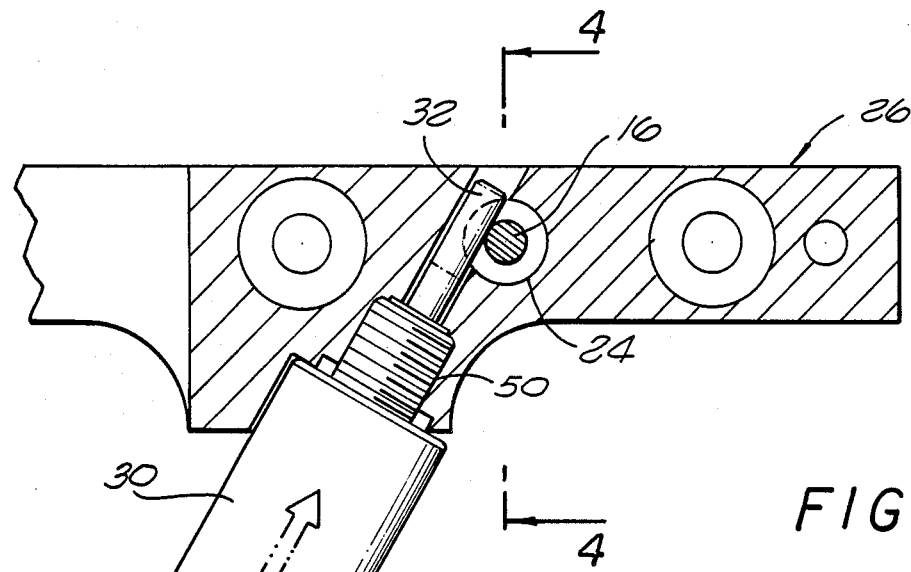
FIG. 3 is a portrayal cut-away view taken along the line 3—3 showing the relationship between the solenoid and the guide pin.

An electronic module retention system is described. In the following description, numerous details such as component shapes and voltage levels are set forth in order to provide a more thorough description of the present invention. In other instances, well known elements such as solenoids and power supplies are not described in detail so as not to obscure the present invention unnecessarily.

Moreover, throughout the following description, the present invention is described with reference to computer peripheral modules and a computer system. This description is given because it is presently the preferred embodiment for the present invention. However, this is not the only way in which the invention may be employed. Instead, it will be apparent to those skilled in the art that the locking system of the present invention can be used in any type of electronic system when it is desirable to retain modular units within a housing whenever power is applied to that system.

Referring first to FIG. 1, a perspective view of a computer peripheral module being placed into a computer system housing is shown. The module 10 enters the housing 12 through an opening on the front panel of the housing. The module 10 may contain any one of a number of many types of computer peripheral devices. For example, the module may hold a permanent memory device such as a hard disk or tape drive. Alternatively, the module may contain electronic circuitry such as random access memory or graphics circuitry. The module is supported within the housing 12 by means of support rails. Although this particular supporting arrangement is shown, it will be apparent to those skilled in the art that equivalent methods can be used without departing from the scope of the present invention. The rails can be attached to the side of the module or located underneath it. In FIG. 1, the interior circuitry of the peripheral module is not shown. This is because the exact type of peripheral device is not an element of the present invention. As such, the particular internal circuitry is omitted. This is done to provide a better understanding of the locking elements which make up the present invention.

Referring again to FIG. 1, the cutaway portion of the housing 12 reveals the backplane 18 of the computer system housing. Projecting from the backplane 18 into the housing 12 are two guide pins 16. Also mounted on the backplane 18 is an electrical connector 14b. Connector 14a is mounted on the outside surface of the module 10. Connectors 14a and 14b are aligned in such a way that when the module 10 is inserted within the housing 12, the two elements 14a and 14b couple, thereby allowing electrical communication between the computer system and the peripheral module.

Located within the module 10 is a bracket 26. The bracket 26 is best shown in FIG. 2. When the module is inserted within the housing, the pins 16 pass through guide holes located in the rear panel of the module and into the bracket 26. In this manner, the bracket 26 and the guide pins 16 work together to align the module properly within the housing. This allows the connector elements to properly mate and helps prevent damage to the connector 14.

Figures 5A, 5B:
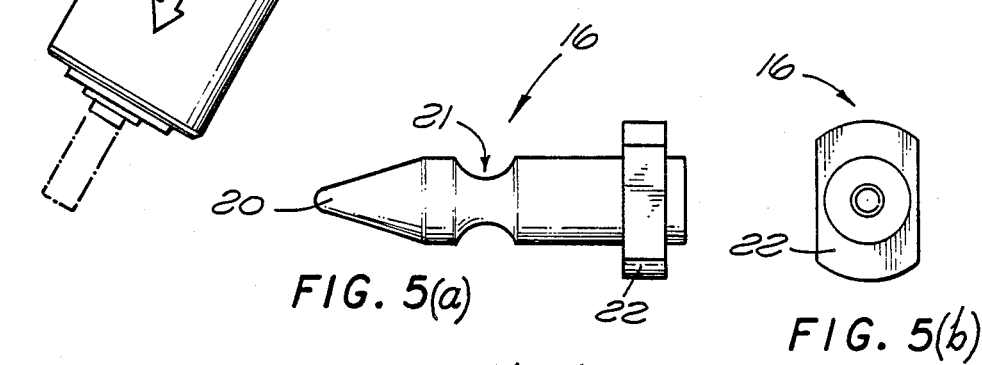
FIG. 5a is a side view of the guide pin of the present invention.
FIG. 5b is an end view of the guide pin of the present invention.

Referring next to FIG. 5, an illustration of one of the guide pins 16 is shown. The pin has a flange 22 at one end. In the preferred embodiment, the pin has a flange 22 at one end. In the preferred embodiment, the pin has a threaded hole located axially within the pin at the flange end. This threaded hole is used to connect the pin 16 to the backplane 18 with a screw (not shown in FIG. 5). However, it will be appreciated by those skilled in the art that various means of connecting the pin to the backplane can be used. Opposite the flange 22 is a tapered portion 20. This is best shown in FIG. 5a. The tapered portion of the pin passes through the guide holes 24 and into the bracket 26 within the module 10. By tapering this portion of the pin 20, insertion of the module within the housing is made easier because there can be slight misalignment of the module. The tapered portion of the pin will force the module to move to its correct location as it is placed within the housing.

The pin 16 also contains a narrow portion 21 on its shank where the diameter of the pin is reduced. As will be described more fully below with reference to FIGS. 3 and 4, the narrow portion engages with the solenoid pin mounted on the bracket 26 thereby retaining the module within the housing. In the preferred embodiment, there are no sharp edges on the extended portion of the pin, all of the corners are rounded. This reduces the amount of wear on the guide pin 16 and the matching portion of the bracket 26. In the preferred embodiment, the pin is manufactured from stainless steel, however other equivalent materials, such as hard plastic can be used to achieve the same results.

Referring again to FIG. 2, the preferred embodiment of the bracket 26 is shown mounted within the housing. In the preferred embodiment the bracket is machined from a single piece of stainless steel. However, it will be apparent to those skilled in the art that equivalent materials and methods of construction can be used to achieve the same result. The bracket is located at the rear end of the module 10 and attaches to the inner surface of the rear wall of the module by means of screws 36 and 37 and nuts. The screws 36 are placed through holes 28 in the bracket. As noted above, two guide holes 24 are placed in the bracket. Although two guide holes are used in the preferred embodiment, it will be apparent to those skilled in the art that a different number of holes, such as three or even a single hole, can be used in conjunction with the guide pins to achieve the proper alignment of the module within the housing. Also present within the bracket is a threaded hole 50 for receiving the solenoid 31. This is best shown in FIG. 3. In the preferred embodiment the solenoid is mounted at the angle. This mounting technique is chosen because it requires a minimum amount of space within the module.

Figure 4:
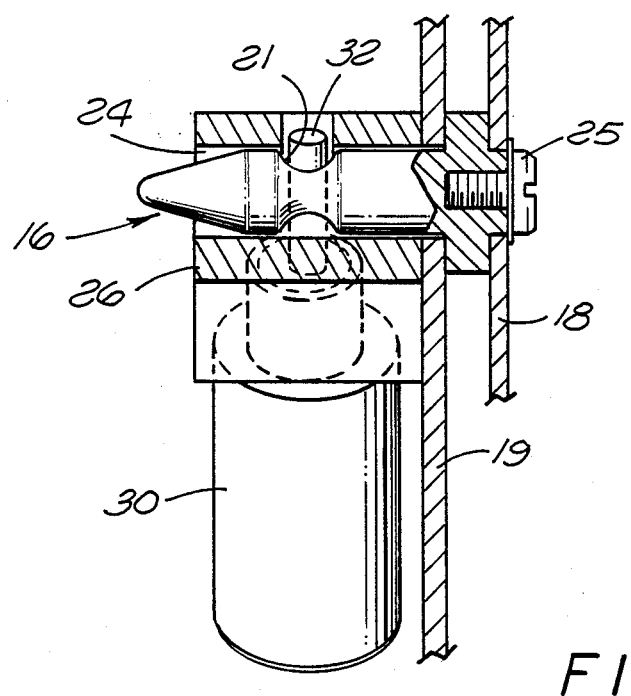
FIG. 4 is a cross sectional view along the line 4—4 illustrating how the solenoid pin engages with the narrow portion of the guide pin.

Referring next to FIGS. 3 and 4, two cross-sectional views illustrating solenoid mounted within the bracket are given. In both of these views, the module is placed within the computer housing and the guide pin is within the guide hole 24. The solenoid 31 mounts within the bracket 26. The solenoid is chosen such that when no power is applied to it, the solenoid pin 32 is withdrawn within the solenoid body 30. When power is applied to the solenoid, the solenoid pin 32 extends. In the preferred embodiment, a solenoid with a 12 volt duty cycle is chosen, but only 4 volts is used to energize it. This approach minimizes the amount of power consumed by the retainer system, thereby reducing its cost of operating. As illustrated, the solenoid is placed such that when the solenoid pin extends, it contacts the narrow portion 21 of the guide pin 16 tangentially. In FIG. 4, the solenoid 31 is shown with the solenoid pin 32 extended. When the solenoid pin 32 is retracted, it is in the position shown by the dotted lines. The solenoid pin 32 moves along the axis of the solenoid 31 as indicated by the arrow in FIG. 5. The narrow portion of the guide pin is curved so as to accommodate the radius of the solenoid pin. It will be apparent to those skilled in the art that other methods can be used to keep the solenoid from moving with respect to the guide pin. For example the guide pin can have a hole located through its diameter. Then the solenoid pin would pass completely through the guide pin. The present arrangement is preferred, however, because it minimizes problems of alignment of the solenoid and guide pin.

Referring again to FIG. 2, cable 40 extends from the solenoid 31 to the power supply of the module 12. The power supply for the module is not shown in FIG. 2. The design of the module is not critically important to the present invention. All that is required is than when power supplied to the module, a signal is sent through cable 40 to solenoid 31, thereby powering the solenoid an extending the solenoid pin 32 so as to engage with the tape proportion 20 of the guide pin 16.

The operation of the present invention is quite straightforward. The user inserts the module within the housing and effectuates the contacts between the connectors 14a and 14b. Whenever power supplied to the computer system, the solenoid is engaged through a current which passes through cable 40. When the solenoid pin 32 is extended, the module is held in place. This is because the solenoid pin is locked into position in contact with the narrow portion 21 of the guide pin 16. The solenoid keeps the module locked in place, and prevents it from being withdrawn from the housing. When power to the module's power supply is disconnected, the solenoid is automatically de-energized. This allows the solenoid pin 32 to retract back into solenoid body 30. The module is no longer held in place and can be freely removed.

The foregoing has described a retention system for use in conjunction with modular electronic units, and specifically for use with computer peripheral units of a computer system. The invention has been described with respect to specific exemplary embodiments thereof. It will be apparent to the skilled in the art that changes from the described embodiment can be made without departing from the overall spirit and sculpt of the present invention. Some of these changes have been described. Others are possible. The foregoing description, therefore, is to regarded as descriptive rather than restrictive. The scope of the present invention is limited only by the following claims.

What is claimed is:

1. A system removably retaining a modular electronic unit within a housing of an electronic system, comprising:

at least one guide pin mounted on a backplane of said housing and extending inwardly into said housing;

a bracket mounted on an inner wall of said modular unit, said bracket being disposed such that with said module inserted within said housing, said at least one guide pin passes through a corresponding number of openings in a wall of said module and at least one opening in said bracket;

a solenoid mounted on said bracket, said solenoid being disposed such that with said solenoid energized, a solenoid pin in said solenoid extends adjacent to and interacts with said guide pin so as to prevent said module from moving and when said solenoid is de-energized said solenoid pin automatically retracts away from said guide pin and into a body of said solenoid so as to allow said module to be removed from said housing.

2. The device of claim 1 wherein said solenoid is connected to a power supply of said modular electronic unit such that when power is not applied to said power supply, said solenoid pin is retracted within said solenoid, and when electrical power is connected to said power supply, said solenoid pin is extended.

3. The device of claim 1 wherein said guide pin contains a narrow portion and wherein said solenoid is arranged such that when said solenoid pin is extended, it contacts said narrow portion of said guide pin in a substantially tangential manner.

4. The device of claim 3 wherein there are two guide pins connected to said backplane.

5. A system removeably retaining a modular computer peripheral unit within a computer system housing while electrical power is applied to said peripheral unit, comprising:

a bracket connected to a backwall of said peripheral unit;

at least one guide pin connected to a backplane of said housing, said backwall of said peripheral unit having disposed therethrough a corresponding number of openings;

wherein said at least one guide pin, said corresponding number of openings, and said bracket are disposed such that with said peripheral unit placed within said housing, said at least one guide pin passes through said corresponding number of openings and at least one opening in said bracket;

a solenoid mounted on said bracket, adjacent to said at least one guide pin, said solenoid being electrically connected to a power supply of said peripheral unit, such that with electrical power supplied to said peripheral unit, a solenoid pin of said solenoid extends and in the absence of electrical power said solenoid pin retracts into a body of said solenoid;

wherein said solenoid is disposed such that with solenoid pin extended, said solenoid pin is located within a narrow portion of said at least one guide pin, thereby preventing movement of said peripheral unit and with said solenoid retracted, said computer peripheral unit may be freely removed from said computer system housing.

6. The system of claim 5 wherein there are first and second guide pins, and said solenoid is located adjacent to said at least one guide pin.

* * * * *

UNITED STATES PATENT AND TRADEMARK OFFICE
CERTIFICATE OF CORRECTION

PATENT NO. : 4,980,800
DATED : December 25, 1990
INVENTOR(S) : Furuta

It is certified that error appears in the above-indentified patent and that said Letters Patent is hereby corrected as shown below:

| | | |
|---|---|---|
| col. 03, line 30 | delete "14b" | insert --14a-- |
| col. 04, lines 17-18 | delete "and 37 and nuts" | insert --and nuts 37-- |
| col. 05, line 33 | delete "electronic" | |
| col. 05, line 40 | delete "module" | insert --modular unit-- |
| col. 05, line 42 | delete "module" | insert --modular unit-- |
| col. 05, line 48 | delete "module" | insert --modular unit-- |
| col. 06, line 01 | delete "module" | insert --modular unit-- |

Signed and Sealed this

Tenth Day of May, 1994

*Attest:*

BRUCE LEHMAN

*Attesting Officer*     *Commissioner of Patents and Trademarks*